United States Patent [19]

Okada et al.

[11] Patent Number: 4,663,584
[45] Date of Patent: May 5, 1987

[54] INTERMEDIATE POTENTIAL GENERATION CIRCUIT

[75] Inventors: Yoshio Okada, Tokyo; Mitsuru Shimizu, Sakura, both of Japan

[73] Assignee: Kabushiki Kaisha Toshiba, Kawasaki, Japan

[21] Appl. No.: 868,580

[22] Filed: May 30, 1986

[30] Foreign Application Priority Data

Jun. 10, 1985 [JP] Japan .................... 60-125670

[51] Int. Cl.[4] ................................. G05F 5/08
[52] U.S. Cl. ..................... 323/313; 323/315; 307/296 R; 307/495
[58] Field of Search .............. 323/312–316; 307/296 R, 296 A, 297, 304, 491, 494–497; 330/296, 297, 299, 300

[56] References Cited

U.S. PATENT DOCUMENTS 4,305,011 12/1981 Audaire et al. ............ 323/314 X
4,346,344 8/1982 Blauschild ............... 323/313
4,464,588 8/1984 Wieser ............... 323/313 X

FOREIGN PATENT DOCUMENTS 58-22425 2/1983 Japan .................... 323/313
58-40633 3/1983 Japan .................... 323/313

Primary Examiner—Patrick R. Salce
Assistant Examiner—Emanuel T. Voeltz
Attorney, Agent, or Firm—Finnegan, Henderson, Farabow, Garrett & Dunner

[57] ABSTRACT

Two intermediate potentials of small current driving capacity are generated using load elements and MOS transistors, and are respectively supplied to the gates of two MOS transistors which are series-connected between power sources and have large current driving capacity, thus obtaining an intermediate potential from a node between the MOS transistors. The MOS transistors at the output stage are complementarily operated so as not to be turned on at the same time.

12 Claims, 9 Drawing Figures

F I G. 7
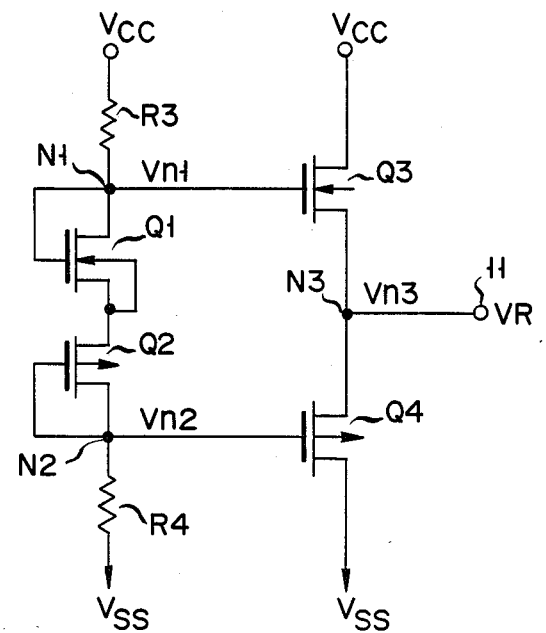
F I G. 8
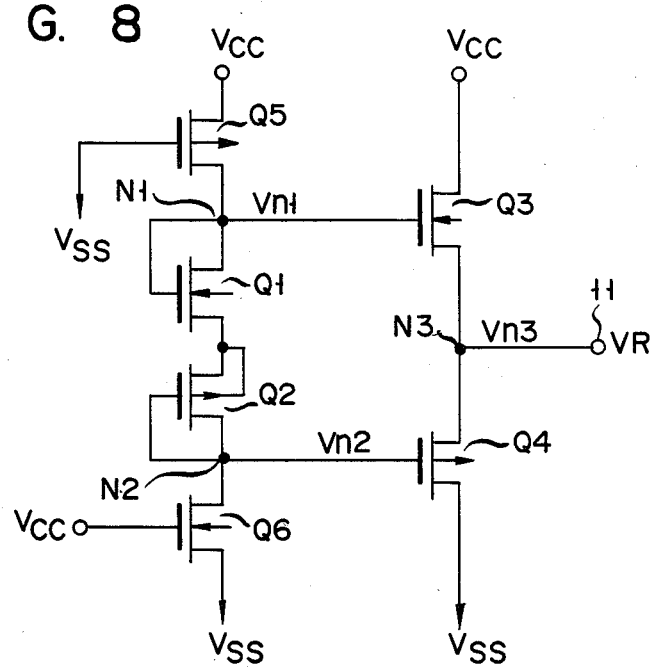

F I G. 9
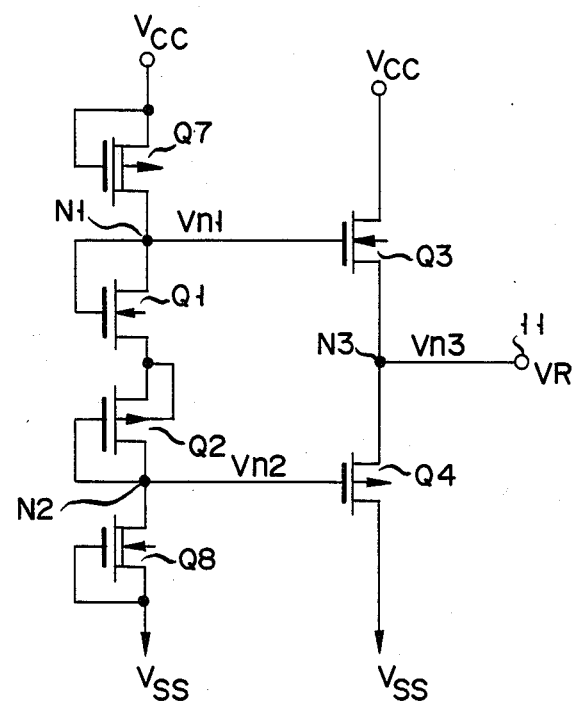

INTERMEDIATE POTENTIAL GENERATION CIRCUIT

BACKGROUND OF THE INVENTION

The present invention relates to an intermediate potential generation circuit, which is formed in a semiconductor integrated circuit device and generates an intermediate potential from a power source voltage applied to the device.

A conventional intermediate potential generation circuit formed in a semiconductor integrated circuit device has an arrangement shown in FIG. 1. Resistors R1 and R2 are series-connected between power sources Vcc and Vss to divide the power source voltage. Intermediate potential VR is obtained from a node between resistors R1 and R2. The Intermediate potential generating circuit is only used for an auxiliary circuit, and need not provide large current output. For this reason, the intermediate potential generation circuit of resistance division type shown in FIG. 1 meets the requirements of conventional semiconductor integrated circuit devices.

In recent large-scale semiconductor integrated circuit devices, however, an operation method thereof is complicated, and an intermediate potential generation circuit having a large current driving capacity is required. In addition, current consumption must be kept as low as possible. However, in the intermediate potential generation circuit shown in FIG. 1, if an output current is to be increased, a large current must flow from power source Vcc to source Vss. The current from source Vcc to source Vss must be, e.g., 10 times the output current. Therefore, current consumption is considerably increased.

Thus, in the conventional intermediate potential generation circuit shown in FIG. 1, both the requirements of large current driving capacity and lower current consumption cannot be satisfied at the same time.

SUMMARY OF THE INVENTION

It is, therefore, an object of the present invention to provide an intermediate potential generation circuit with low current consumption and large current driving power.

According to an aspect of the present invention, there is provided an intermediate potential generation circuit comprising: a first load element, one end of which is connected to a first potential supply source; a first MOS transistor of a first conductivity type, one end and a gate of which are connected to the other end of the first load element; a second MOS transistor of a second conductivity type, one end of which is connected to the other end of the first MOS transistor; a second load element connected between the other end and a gate of the second MOS transistor and a second potential supply source; a third MOS transistor of the first conductivity type having one end connected to the first potential supply source and a gate connected to a node between the first load element and the first MOS transistor; and a fourth MOS transistor of the second conductivity type connected between the other end of the third MOS transistor and the second potential supply source, and having a gate connected to a node between the second MOS transistor and the second load element, wherein an intermediate potential between the first and second potential supply sources is obtained from an output terminal connected to a node between the third and fourth MOS transistors.

With this arrangement, an intermediate potential generation circuit with low current consumption and large current driving capacity can be provided.

BRIEF DESCRIPTION OF THE DRAWINGS

FIGS. 4 to 9 are circuit diagrams of intermediate potential generation circuits according to other embodiments of the present invention.

DETAILED DESCRIPTION OF THE PREFERRED EMBODIMENTS

Figure 1:
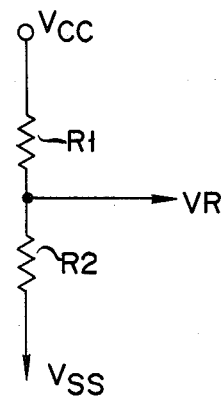
FIG. 1 is a circuit diagram of a conventional intermediate potential generation circuit.
Figure 2:
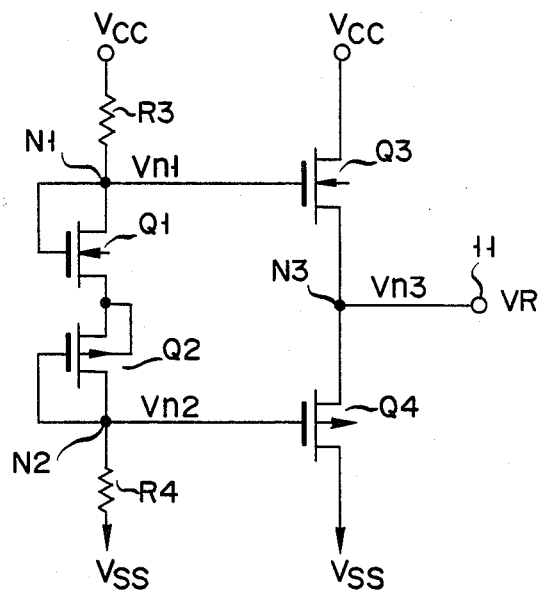
FIG. 2 is a circuit diagram of an intermediate potential generation circuit according to an embodiment of the present invention.

FIG. 2 shows an intermediate potential generation circuit according to an embodiment of the present invention. In this circuit, resistor R3, N-channel MOS transistor Q1, P-channel MOS transistor Q2, and resistor R4 are series-connected between power source Vcc (first potential supply source) and power source Vss (second potential supply source). The gate of MOS transistor Q1 is connected to node N1 between MOS transistor Q1 and resistor R3. The gate of MOS transistor Q2 is connected to node N2 between transistor Q2 and resistor R4. The back gate of MOS transistor Q2 is connected to a node between transistors Q1 and Q2. Node N1 is connected to the gate of N-channel MOS transistor Q3, one end of which is connected to power source Vcc. Node N2 is connected to the gate of P-channel MOS transistor Q4, which is connected between the other end of transistor Q3 and power source Vss. Node N3 between transistors Q3 and Q4 is connected to output terminal 11, such that intermediate potential VR between power sources Vcc and Vss is obtained therefrom.

If threshold voltages of MOS transistors Q1, Q2, Q3, and Q4 are given by $V_{tn1}$, $V_{tp1}$, $V_{tn2}$, and $V_{tp2}$, respectively, they are set to have relations: $V_{tn1} + |V_{tp1}| < V_{tn2} + |V_{tp2}|$ therebetween. These relations can be obtained such that the back gate of MOS transistor Q2 is connected to the node between MOS transistors Q1 and Q2 to reduce threshold voltage $V_{tp1}$ of MOS transistor Q2. This is done to prevent MOS transistors Q3 and Q4 from being turned on at the same time. Channel widths W3 and W4 of MOS transistors Q3 and Q4 are set to be larger than channel widths W1 and W2 of MOS transistors Q1 and Q2. This is done to obtain a sufficiently large current driving capacity and to immediately restore a stable output level after variation therein occurs.

Figure 3:
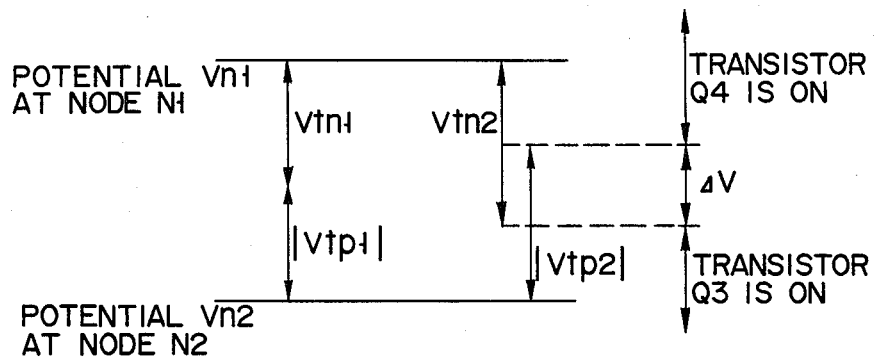
FIG. 3 is a diagram for explaining an operation of the circuit shown in FIG. 2.

The operation of the circuit shown in FIG. 2 will now be described with reference to FIG. 3. Two intermediate potentials Vn1 and Vn2 of small current driving capacity appear at nodes N1 and N2 between respective pairs of resistors R3 and R4 with MOS transistors Q1 and Q2. Assuming that resistances of resistors R3 and R4 are equal, a potential at the node between MOS transistors Q1 and Q2 is equal to an intermediate potential (Vcc/2, if Vss=0 V) between power sources Vcc and Vss. Therefore, potential Vn1 at node N1 is a potential which is increased from Vcc/2 by threshold voltage Vtn1 of MOS transistor Q1, and potential Vn2 at node N2 is a potential which is decreased from Vcc/2 by the absolute value of threshold voltage Vtp1 of transistor Q2. Two intermediate potentials Vn1 and Vn2 enable MOS transistors Q3 and Q4 of large driving capacity, respectively. If potential Vn3 at node N3 is higher than a sum of potential Vn2 at node N2 and the absolute value of threshold voltage Vtp2 of MOS transistor Q4, MOS transistor Q4 is turned on (at this time, MOS transistor Q3 is turned off), thus decreasing output potential VR. On the other hand, if potential Vn3 at node N3 is lower than the difference between threshold voltage Vtn2 of MOS transistor Q3 and potential Vn1 at node N1, MOS transistor Q3 is turned on (at this time, MOS transistor Q4 is turned off), thus increasing output potential VR. When the above operation is repeated, output potential VR is set to fall within a range between power sources Vcc and Vss.

With the above arrangement, since MOS transistors Q3 and Q4 of large driving capacity at the output stage can no longer be turned on at the same time, no large through current flows from source Vcc toward Vss through MOS transistors Q3 and Q4. A through current flowing from power source Vcc to Vss through transistors Q1 and Q2 can be sufficiently reduced by increasing the resistance of resistors R3 and R4. Although output potential VR has an unstable factor corresponding to overlap portion $\Delta V$, where $\Delta V = Vtn2 + |Vtp2| - (Vtn1 + |Vtp1|)$, as shown in FIG. 3, threshold voltages Vtn2 and Vtp2 of transistors Q1 and Q2 can be controlled so as to decrease the unstable factor to a negligible level. A level of output potential VR can be freely set between power source Vcc and Vss in accordance with resistance R3 and R4, and threshold voltages Vtn1, Vtp1, Vtn2, and Vtp2 of MOS transistors Q1 to Q4. However, the above relations between the threshold voltages must be satisfied.

As described above, since MOS transistors Q3 and Q4 of large driving capacity are alternately turned on/off so as not to be turned on at the same time, an intermediate potential generation circuit with low current consumption and large current driving capacity can be obtained.

Figure 4:
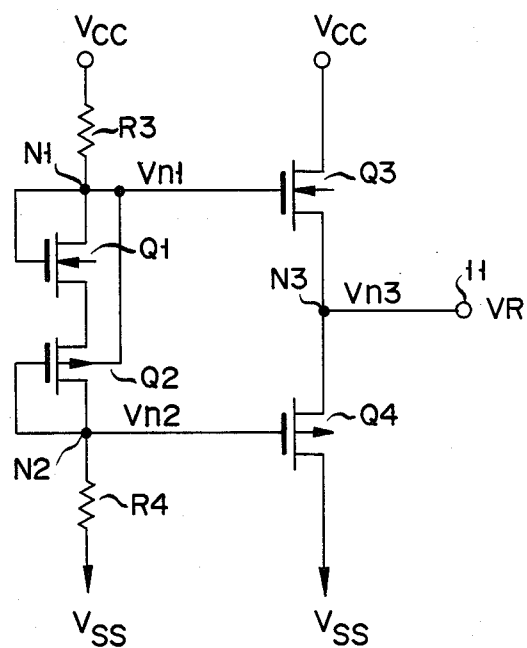

FIG. 4 shows an intermediate potential generation circuit according to another embodiment of the present invention. The same reference numerals in FIG. 4 denote the same parts as in FIG. 2, and a detailed description thereof will be omitted. In the circuit of FIG. 2, the back gate of MOS transistor Q2 is connected to the node between transistors Q1 and Q2. However, in the circuit shown in FIG. 4, the back gate of transistor Q2 is connected to node N1 between resistor R3 and MOS transistor Q1.

With the above arrangement, since the relationships between the threshold voltages can also be accomplished, the same operation and effect as in the above embodiment can be obtained.

Figure 5:
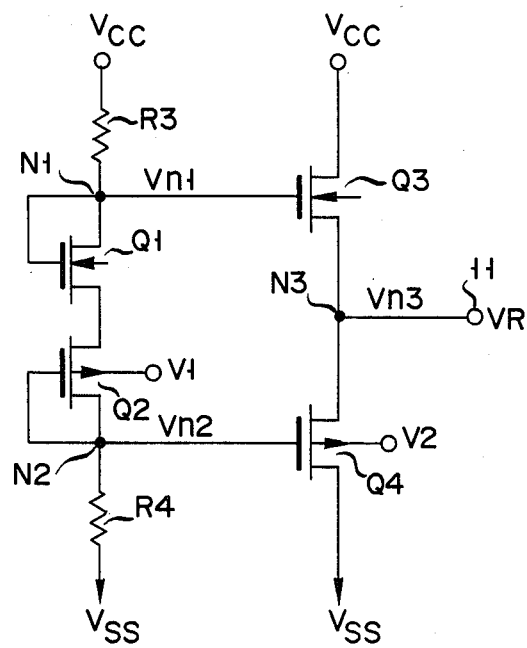

As shown in FIG. 5, when potentials V1 and V2 having the relation "V1<V2" are applied to the back gates of MOS transistors Q2 and Q4, respectively, the above relations between the threshold voltages of MOS transistors Q1 to Q4 can be satisfied. In other words, a potential of the back gate of MOS transistor Q2 need only be set to be lower than that of MOS transistor Q4.

Figure 6:
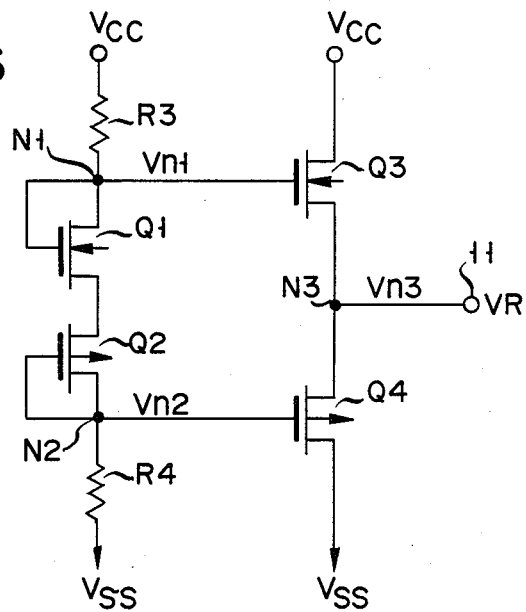

In addition, the above relations of the threshold values of MOS transistors Q1 to Q4 can also be achieved not only by arrangements in FIGS. 2, 4, and 5 in which the potential at the back gate of MOS transistor Q2 is set to be lower than that of MOS transistor Q4, but also by an arrangement in FIG. 6 in which the potential at the back gate of MOS transistor Q2 is set equal to that of MOS transistor Q4, and a channel length of MOS transistor Q2 is reduced to be smaller than that of MOS transistor Q4. Alternatively, an impurity concentration of a channel region of MOS transistor Q2 can be set to be higher than that of MOS transistor Q4.

In the above embodiments, a case has been exemplified wherein an n-type well region is formed in a p-type semiconductor substrate, and MOS transistors Q1 to Q4 and resistors R3 and R4 are formed in the semiconductor substrate and the well region to provide the intermediate potential generation circuit. However, when a p-type well region is formed in an n-type semiconductor substrate and MOS transistors Q1 to Q4 and resistors R3 and R4 are formed in the semiconductor substrate and the well region, the relations of the threshold voltages of transistors Q1 to Q4 can be achieved with the following arrangement: the back gate of MOS transistor Q1 is connected to the node between MOS transistors Q1 and Q2 as shown in FIG. 7, so that the potential at the back gate of MOS transistor Q1 is set to be lower than that of MOS transistor Q3. Similarly, the methods described with reference to FIGS. 4 to 6 can also be used.

FIG. 8 shows an intermediate potential generation circuit according to another embodiment of the present invention. The same reference numerals in FIG. 8 denote the same parts as in FIG. 2, and a detailed description thereof will be omitted. In this embodiment, MOS transistors are used as load elements. More specifically, enhancement type P-channel MOS transistor Q5 is used in place of resistor R3 in FIG. 3, and enhancement type N-channel MOS transistor Q6 is used in place of resistor R4. The gate of MOS transistor Q5 is connected to power source Vss to be kept on, and the gate of MOS transistor Q6 is connected to power source Vcc to be kept on.

With this arrangement, the same operation and effect as in the above embodiments can be realized.

As shown in FIG. 9, depletion type MOS transistors Q7 and Q8 can also be used as load elements. In this embodiment, the gate of depletion type P-channel MOS transistor Q7 is connected to power source Vcc, and the gate of depletion type N-channel MOS transistor Q8 is connected to power source Vss.

What is claimed is:

1. An intermediate potential generation circuit, comprising:
    a first potential supply source;
    a first load element, one end of which is connected to said first potential supply source;
    a first MOS transistor of a first conductivity type, one end and a gate of which are connected to the other end of said first load element;
    a second MOS transistor of a second conductivity type, one end of which is connected to the other end of said first MOS transistor;
    a second load element, one end of which is connected to the other end and a gate of said second MOS transistor;
    a second potential supply source connected to the other end of said second load element;
    a third MOS transistor of the first conductivity type having one end connected to said first potential supply source and a gate connected to a node between said first load element and said first MOS transistor;

a fourth MOS transistor of the second conductivity type connected between the other end of said third MOS transistor and said second potential supply source, and having a gate connected to a node between said second MOS transistor and said second load element; and an output terminal, connected to a node between said third and fourth MOS transistors, for generating an intermediate potential between said first and second potential supply sources.

2. A circuit according to claim 1, wherein a sum of the threshold voltage of said first MOS transistor and the absolute value of the threshold voltage of said second MOS transistor is smaller than a sum of the threshold voltage of said third MOS transistor and the absolute value of the threshold voltage of said fourth MOS transistor.

3. A circuit according to claim 1, wherein the threshold voltage of said first MOS transistor is lower than the threshold voltage of said third MOS transistor, and the absolute value of the threshold voltage of said second MOS transistor is lower than the absolute value of a threshold voltage of said fourth MOS transistor.

4. A circuit according to claim 1, wherein a potential at a back gate of said second MOS transistor is lower than that at a back gate of said fourth MOS transistor.

5. A circuit according to claim 1, wherein a back gate of said second MOS transistor is connected to a node between said first and second MOS transistors.

6. A circuit according to claim 1, wherein a back gate of said second MOS transistor is connected to a node between said first load element and said first MOS transistor.

7. A circuit according to claim 1, wherein an impurity concentration of a channel region of said second MOS transistor is higher than that of a channel region of said fourth MOS transistor.

8. A circuit according to claim 1, wherein a channel length of said second MOS transistor is smaller than that of said fourth MOS transistor.

9. A circuit according to claim 1, wherein channel widths of said third and fourth MOS transistors are wider than those of said first and second MOS transistors.

10. A circuit according to claim 1, wherein said first and second load elements respectively comprise resistors.

11. A circuit according to claim 1, wherein said first load element comprises an enhancement type MOS transistor of the second conductivity type, a gate of which is connected to said second potential supply source, and said second load element comprises an enhancement type MOS transistor of the first conductivity type, a gate of which is connected to said first potential supply source.

12. A circuit according to claim 1, wherein said first load element comprises a depletion type MOS transistor of the second conductivity type, a gate of which is connected to said first potential supply source, and said second load element comprises a depletion type MOS transistor of the first conductivity type, a gate of which is connected to said second potential supply source.

* * * * *

REEXAMINATION CERTIFICATE (2886th)

United States Patent [19]
Okada et al.

[11] B1 4,663,584
[45] Certificate Issued May 21, 1996

[54] INTERMEDIATE POTENTIAL GENERATION CIRCUIT

[75] Inventors: Yoshio Okada, Tokyo; Mitsuru Shimizu, Sakura, both of Japan

[73] Assignee: Kabushiki Kaisha Toshiba, Kawasaki, Japan

Reexamination Request:
No. 90/003,776, Mar. 30, 1995

Reexamination Certificate for:
Patent No.: 4,663,584
Issued: May 5, 1987
Appl. No.: 868,580
Filed: May 30, 1986

[30] Foreign Application Priority Data

Jun. 10, 1985 [JP] Japan .................. 60-125670

[51] Int. Cl.⁶ .................................................. G05F 5/08
[52] U.S. Cl. .................. 323/313; 323/315; 307/296 R; 307/495
[58] Field of Search ........................... 323/312, 313, 323/314, 315, 316; 327/535, 538, 540, 541, 543, 544, 561, 563, 581; 330/296, 297, 299, 300

[56] References Cited

U.S. PATENT DOCUMENTS

| | | | |
|---|---|---|---|
| 3,832,644 | 8/1974 | Nagata et al. | 330/22 |
| 4,051,354 | 9/1977 | Choate | 235/312 |
| 4,096,430 | 6/1978 | Waldron | 323/22 R |
| 4,100,437 | 7/1978 | Hoff, Jr. | 307/297 |
| 4,205,263 | 5/1980 | Kawagai et al. | 323/22 R |
| 4,250,570 | 2/1981 | Tsang et al. | 365/200 |
| 4,254,477 | 3/1981 | Hsia et al. | 365/200 |
| 4,264,828 | 4/1981 | Perlegos et al. | 307/463 |
| 4,305,011 | 12/1981 | Audaire et al. | 323/314 |
| 4,346,344 | 8/1982 | Blauschild | 323/313 |
| 4,346,459 | 8/1982 | Sud et al. | 365/200 |
| 4,347,476 | 8/1982 | Tam | 323/313 |
| 4,375,596 | 3/1993 | Hoshi | 323/313 |
| 4,389,715 | 6/1983 | Eaton, Jr. et al. | 365/200 |
| 4,429,374 | 1/1984 | Tanimura | 365/230 |
| 4,441,170 | 4/1984 | Folmsbee et al. | 365/200 |
| 4,451,744 | 5/1984 | Adam | 307/297 |
| 4,464,588 | 8/1984 | Wieser | 323/313 |
| 4,587,638 | 5/1986 | Isobe et al. | 365/200 |
| 4,609,833 | 9/1986 | Guterman | 307/297 |
| 4,616,172 | 10/1986 | Rahim | 323/313 |
| 4,633,429 | 12/1986 | Lewandowski et al. | 365/96 |
| 4,634,894 | 1/1987 | Shu et al. | 307/297 |
| 4,645,998 | 2/1987 | Shinohara et al. | 323/213 |
| 4,670,706 | 6/1987 | Tobita | 323/213 |
| 4,683,382 | 7/1987 | Sakurai et al. | 307/296 R |
| 4,740,743 | 4/1988 | Reisinger et al. | 323/316 |
| 4,812,735 | 3/1989 | Sawada et al. | 323/313 |
| 4,849,654 | 7/1989 | Okada | 307/296.4 |
| 4,857,763 | 8/1989 | Sakurai et al. | 307/443 |
| 5,008,609 | 4/1991 | Fukiage | 323/313 |
| 5,027,053 | 6/1991 | Ohri et al. | 323/314 |
| 5,030,848 | 7/1991 | Wyatt | 307/296.8 |
| 5,270,589 | 12/1989 | Sawada et al. | 307/475 |

FOREIGN PATENT DOCUMENTS

| | | |
|---|---|---|
| 0145254 | 6/1985 | European Pat. Off. . |
| 57-157315 | 9/1982 | Japan . |
| 58-8328 | 1/1983 | Japan . |
| 58-22425 | 2/1983 | Japan .................. 323/313 |
| 58-40633 | 3/1983 | Japan .................. 323/313 |
| 58-140825 | 8/1983 | Japan . |
| 59-157727 | 9/1984 | Japan . |
| 59-205823 | 11/1984 | Japan . |
| 60-85622 | 5/1985 | Japan . |
| 60-103827 | 6/1985 | Japan . |

OTHER PUBLICATIONS

Device Electronics for Integrated Circuits by Richard S. Miller and Theodore I. Kamins, John Wiley & Sons, 1977, pp. 436–437.

*Primary Examiner*—Matthew V. Nguyen

[57] ABSTRACT

Two intermediate potentials of small current driving capacity are generated using load elements and MOS transistors, and are respectively supplied to the gates of two MOS transistors which are series-connected between power sources and have large current driving capacity, thus obtaining an intermediate potential from a node between the MOS transistors. The MOS transistors at the output stage are complementarily operated so as not to be turned on at the same time.

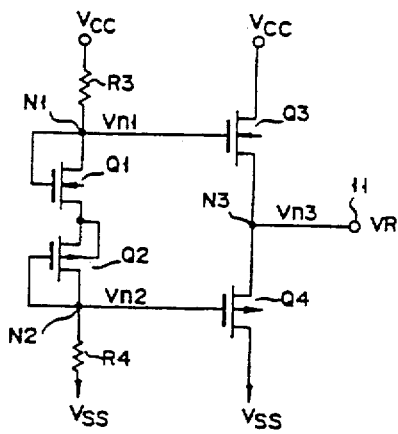

B1 4,663,584

REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

Claims 1 and 10 are cancelled.

Claims 2–9, 11 and 12 are determined to be patentable as amended.

New claims 13–46 are added and determined to be patentable.

2. [A] *An intermediate potential generation circuit* [according to claim 1], *comprising:*

*a first potential supply source;*

*a first load element, one end of which is connected to said first potential supply source;*

*a first MOS transistor of a first conductivity type, one end and a gate of which are connected to the other end of said first load element;*

*a second MOS transistor of a second conductivity type, one end of which is connected to the other end of said first MOS transistor;*

*a second load element, one end of which is connected to the other end and a gate of said second MOS transistor;*

*a second potential supply source connected to the other end of said second load element;*

*a third MOS transistor of the first conductivity type having one end connected to said first potential supply source and a gate connected to a node between said first load element and said first MOS transistor;*

*a fourth MOS transistor of the second conductivity type connected between the other end of said third MOS transistor and said second potential supply source, and having a gate connected to a node between said second MOS transistor and said second load element, wherein a sum of the threshold voltage of said first MOS transistor and the absolute value of the threshold voltage of said second MOS transistor is smaller than a sum of the threshold voltage of said third MOS transistor and the absolute value of the threshold voltage of said fourth MOS transistor[.]; and*

*an output terminal, connected to a node between said third and fourth MOS transistors, for generating an intermediate potential between said first and second potential supply sources.*

3. [A] *An intermediate potential generation circuit* [according to claim 1], *comprising:*

*a first potential supply source;*

*a first load element, one end of which is connected to said first potential supply source;*

*a first MOS transistor of a first conductivity type, one end and a gate of which are connected to the other end of said first load element;*

*a second MOS transistor of a second conductivity type, one end of which is connected to the other end of said first MOS transistor;*

*a second load element, one end of which is connected to the other end and a gate of said second MOS transistor;*

*a second potential supply source connected to the other end of said second load element;*

*a third MOS transistor of the first conductivity type having one end connected to said first potential supply source and a gate connected to a node between said first load element and said first MOS transistor;*

*a fourth MOS transistor of the second conductivity type connected between the other end of said third MOS transistor and said second potential supply source, and having a gate connected to a node between said second MOS transistor and said second load element, wherein the threshold voltage of said first MOS transistor is lower than the threshold voltage of said third MOS transistor, and the absolute value of the threshold voltage of said second MOS transistor is lower than the absolute value of a threshold voltage of said fourth MOS transistor[.]; and*

*an output terminal, connected to a node between said third and fourth MOS transistors, for generating an intermediate potential between said first and second potential supply sources.*

4. [A] *An intermediate potential generation circuit* [according to claim 1], *comprising:*

*a first potential supply source;*

*a first load element, one end of which is connected to said first potential supply source;*

*a first MOS transistor of a first conductivity type, one end and a gate of which are connected to the other end of said first load element;*

*a second MOS transistor of a second conductivity type, one end of which is connected to the other end of said first MOS transistor;*

*a second load element, one end of which is connected to the other end and a gate of said second MOS transistor;*

*a second potential supply source connected to the other end of said second load element;*

*a third MOS transistor of the first conductivity type having one end connected to said first potential supply source and a gate connected to a node between said first load element and said first MOS transistor;*

*a fourth MOS transistor of the second conductivity type connected between the other end of said third MOS transistor and said second potential supply source, and having a gate connected to a node between said second MOS transistor and said second load element, wherein a potential at a back gate of said second MOS transistor is lower than that at a back gate of said fourth MOS transistor[.]; and*

*an output terminal, connected to a node between said third and fourth MOS transistors, for generating an intermediate potential between said first and second potential supply sources.*

5. [A] *An intermediate potential generating circuit* [according to claim 1, wherein], *comprising:*

*a first potential supply source;*

*first load element, one end of which is connected to said first potential supply source;*

*a first MOS transistor of a first conductivity type, one end and a gate of which are connected to the other end of said first load element;* a second MOS transistor of a second conductivity type, one end of which is connected to the other end of said first MOS transistor, and a back gate of said second MOS transistor is connected to a node between said first and second MOS transistors[.];

a second load element, one end of which is connected to the other end and a gate of said second MOS transistor;

a second potential supply source connected to the other end of said second load element;

a third MOS transistor of the first conductivity type having one end connected to said first potential supply source and a gate connected to a node between said first load element and said first MOS transistor;

a fourth MOS transistor of the second conductivity type connected between the other end of said third MOS transistor and said second potential supply source, and having a gate connected to a node between said second MOS transistor and said second load element; and an output terminal, connected to a node between said third and fourth MOS transistors, for generating an intermediate potential between said first and second potential supply sources.

6. [A] An intermediate potential generation circuit [according to claim 1, wherein], comprising:

a first potential supply source;

a first load element, one end of which is connected to said first potential supply source;

a first MOS transistor of a first conductivity type, one end and a gate of which are connected to the other end of said first load element;

a second MOS transistor of a second conductivity type, one end of which is connected to the other end of said first MOS transistor, and a back gate of said second MOS transistor is connected to a node between said first load element and said first MOS transistor[.];

a second load element, one end of which is connected to the other end and a gate of said second MOS transistor;

a second potential supply source connected to the other end of said second load element;

a third MOS transistor of the first conductivity type having one end connected to said first potential supply source and a gate connected to a node between said first load element and said first MOS transistor;

a fourth MOS transistor of the second conductivity type connected between the other end of said third MOS transistor and said second potential supply source, and having a gate connected to a node between said second MOS transistor and said second load element; and an output terminal, connected to a node between said third and fourth MOS transistors, for generating an intermediate potential between said first and second potential supply sources.

7. [A] An intermediate potential generation circuit [according to claim 1], comprising:

a first potential supply source;

a first load element, one end of which is connected to said first potential supply source;

a first MOS transistor of a first conductivity type, one end and a gate of which are connected to the other end of said first load element;

a second MOS transistor of a second conductivity type, one end of which is connected to the other end of said first MOS transistor;

a second load element, one end of which is connected to the other end and a gate of said second MOS transistor;

a second potential supply source connected to the other end of said second load element;

a third MOS transistor of the first conductivity type having one end connected to said first potential supply source and a gate connected to a node between said first load element and said first MOS transistor;

a fourth MOS transistor of the second conductivity type connected between the other end of said third MOS transistor and said second potential supply source, and having a gate connected to a node between said second MOS transistor and said second load element, wherein an impurity concentration of a channel region of said second MOS transistor is higher than that of a channel region of said fourth MOS transistor[.]; and an output terminal, connected to a node between said third and fourth MOS transistors, for generating an intermediate potential between said first and second potential supply sources.

8. [A] An intermediate potential generation circuit [according to claim 1], comprising:

a first potential supply source;

a first load element, one end of which is connected to said first potential supply source;

a first MOS transistor of a first conductivity type, one end and a gate of which are connected to the other end of said first load element;

a second MOS transistor of a second conductivity type, one end of which is connected to the other end of said first MOS transistor;

a second load element, one end of which is connected to the other end and a gate of said second MOS transistor;

a second potential supply source connected to the other end of said second load element;

a third MOS transistor of the first conductivity type having one end connected to said first potential supply source and a gate connected to a node between said first load element and said first MOS transistor;

a fourth MOS transistor of the second conductivity type connected between the other end of said third MOS transistor and said second potential supply source, and having a gate connected to a node between said second MOS transistor and said second load element, wherein a channel length of said second MOS transistor is smaller than that of said fourth MOS transistor[.]; and an output terminal, connected to a node between said third and fourth MOS transistors, for generating an intermediate potential between said first and second potential supply sources.

9. [A] An intermediate potential generation circuit [according to claim 1], comprising:

a first potential supply source;

a first load element, one end of which is connected to said first potential supply source;

a first MOS transistor of a first conductivity type, one end and a gate of which are connected to the other end of said first load element;

a second MOS transistor of a second conductivity type, one end of which is connected to the other end of said first MOS transistor;

a second load element, one end of which is connected to the other end and a gate of said second MOS transistor;

a second potential supply source connected to the other end of said second load element;

a third MOS transistor of the first conductivity type having one end connected to said first potential supply source and a gate connected to a node between said first load element and said first MOS transistor;

a fourth MOS transistor of the second conductivity type connected between the other end of said third MOS transistor and said second potential supply source, and having a gate connected to a node between said second MOS transistor and said second load element, wherein channel widths of said third and fourth MOS transistors are wider than those of said first and second MOS transistors[.]; and an output terminal, connected to a node between said third and fourth MOS transistors, for generating an intermediate potential between said first and second potential supply sources.

11. [A] An intermediate potential generation circuit [according to claim 1, wherein], comprising:

a first potential supply source;

a first load element, one end of which is connected to said first potential supply source;

a first MOS transistor of a first conductivity type, one end and a gate of which are connected to the other end of said first load element;

a second MOS transistor of a second conductivity type, one end of which is connected to the other end of said first MOS transistor;

a second load element, one end of which is connected to the other end and a gate of said second MOS transistor;

a second potential supply source connected to the other end of said second load element, said first load element comprises an enhancement type MOS transistor of the second conductivity type, a gate of which is connected to said second potential supply source, and said second load element comprises an enhancement type MOS transistor of the first conductivity type, a gate of which is connected to said first potential supply source[.];

a third MOS transistor of the first conductivity type having one end connected to said first potential supply source and a gate connected to a node between said first load element and said first MOS transistor;

a fourth MOS transistor of the second conductivity type connected between the other end of said third MOS transistor and said second potential supply source, and having a gate connected to a node between said second MOS transistor and said second load element; and an output terminal, connected to a node between said third and fourth MOS transistors, for generating an intermediate potential between said first and second potential supply sources.

12. [A] An intermediate potential generation circuit [according to claim 1, wherein], comprising:

a first potential supply source;

a first load element, one end of which is connected to said first potential supply source;

a first MOS transistor of a first conductivity type, one end and a gate of which are connected to the other end of said first load element;

a second MOS transistor of a second conductivity type, one end of which is connected to the other end of said first MOS transistor;

a second load element, one end of which is connected to the other end and a gate of said second MOS transistor;

a second potential supply source connected to the other end of said second load element, said first load element comprises a depletion type MOS transistor of the second conductivity type, a gate of which is connected to said first potential supply source, and said second load element comprises a depletion type MOS transistor of the first conductivity type, a gate of which is connected to said second potential supply source[.];

a third MOS transistor of the first conductivity type having one end connected to said first potential supply source and a gate connected to a node between said first load element and said first MOS transistor;

a fourth MOS transistor of the second conductivity type connected between the other end of said third MOS transistor and said second potential supply source, and having a gate connected to a node between said second MOS transistor and said second load element; and an output terminal, connected to a node between said third and fourth MOS transistors, for generating an intermediate potential between said first and second potential supply sources.

13. A circuit according to claim 2, wherein a channel length of said second MOS transistor is smaller than that of said fourth MOS transistor.

14. A circuit according to claim 2, wherein channel widths of said third and fourth MOS transistors are wider than those of said first and second MOS transistors.

15. A circuit according to claim 2, wherein said first load element comprises an enhancement type MOS transistor of the second conductivity type, a gate of which is connected to said second potential supply source, and said second load element comprises an enhancement type MOS transistor of the first conductivity type, a gate of which is connected to said first potential supply source.

16. A circuit according to claim 2, wherein said first load element comprises a depletion type MOS transistor of the second conductivity type, a gate of which is connected to said first potential supply source, and said second load element comprises a depletion type MOS transistor of the first conductivity type, a gate of which is connected to said second potential supply source.

17. A circuit according to claim 2, wherein said first conductivity type is N type, and said first potential supply source is Vcc.

18. A circuit according to claim 2, wherein said second conductivity type is P type and said second potential supply source is ground.

19. A circuit according to claim 2, wherein said first conductivity type is N type, and second conductivity type is P type, said first potential supply source is Vcc, and second potential supply source is ground.

20. A circuit according to claim 3, wherein a channel length of said second MOS transistor is smaller than that of said fourth MOS transistor.

21. A circuit according to claim 3, wherein channel widths of said third and fourth MOS transistors are wider than those of said first and second MOS transistors.

22. A circuit according to claim 3, wherein said first load element comprises an enhancement type MOS transistor of the second conductivity type, a gate of which is connected to said second potential supply source, and said second load element comprises an enhancement type MOS transistor of the first conductivity type, a gate of which is connected to said first potential supply source.

23. A circuit according to claim 3, wherein said first load element comprises a depletion type MOS transistor of the second conductivity type, a gate of which is connected to said first potential supply source, and said second load element comprises a depletion type MOS transistor of the first conductivity type, a gate of which is connected to said second potential supply source.

24. A circuit according to claim 3, wherein said first conductivity type is N type, and said first potential supply source is Vcc.

25. A circuit according to claim 3, wherein said second conductivity type is P type and said second potential supply source is ground.

26. A circuit according to claim 3, wherein said first conductivity type of N type, and second conductivity type is P type, said first potential supply source is Vcc, and second potential supply source is ground.

27. A circuit according to claim 5, wherein a channel length of said second MOS transistor is smaller than that of said fourth MOS transistor.

28. A circuit according to claim 5, wherein channel widths of said third and fourth MOS transistors are wider than those of said first and second MOS transistors.

29. A circuit according to claim 5, wherein said first load element comprises an enhancement type MOS transistor of the second conductivity type, a gate of which is connected to said second potential supply source, and said second load element comprises an enhancement type MOS transistor of the first conductivity type, a gate of which is connected to said first potential supply source.

30. A circuit according to claim 5, wherein said first load element comprises a depletion type MOS transistor of the second conductivity type, a gate of which is connected to said first potential supply source, and said second load element comprises a depletion type MOS transistor of the first conductivity type, a gate of which is connected to said second potential supply source.

31. A circuit according to claim 5, wherein said first conductivity type is N type, and said first potential supply source is Vcc.

32. A circuit according to claim 5, wherein said second conductivity type is P type and said second potential supply source is ground.

33. A circuit according to claim 5, wherein said first conductivity type is N type, and second conductivity type is P type, said first potential supply source is Vcc, and second potential supply source is ground.

34. A circuit according to claim 6, wherein a channel length of said second MOS transistor is smaller than that of said fourth MOS transistor.

35. A circuit according to claim 6, wherein channel widths of said third and fourth MOS transistors are wider than those of said first and second MOS transistors.

36. A circuit according to claim 6, wherein said first load element comprises an enhancement type MOS transistor of the second conductivity type, a gate of which is connected to said second potential supply source, and said second load element comprises an enhancement type MOS transistor of the first conductivity type, a gate of which is connected to said first potential supply source.

37. A circuit according to claim 6, wherein said first load element comprises a depletion type MOS transistor of the second conductivity type, a gate of which is connected to said first potential supply source, and said second load element comprises a depletion type MOS transistor of the first conductivity type, a gate of which is connected to said second potential supply source.

38. A circuit according to claim 6, wherein said first conductivity type is N type, and said first potential supply source is Vcc.

39. A circuit according to claim 6, wherein said second conductivity type is P type and said second potential supply source is ground.

40. A circuit according to claim 6, wherein said first conductivity type is N type, and second conductivity type is P type, said first potential supply source is Vcc, and second potential supply source is ground.

41. A circuit according to claim 8, wherein channel widths of said third and fourth MOS transistors are wider than those of said first and second MOS transistors.

42. A circuit according to claim 8, wherein said first load element comprises an enhancement type MOS transistor of the second conductivity type, a gate of which is connected to said second potential supply source, and said second load element comprises an enhancement type MOS transistor of the first conductivity type, a gate of which is connected to said first potential supply source.

43. A circuit according to claim 8, wherein said first load element comprises a depletion type MOS transistor of the second conductivity type, a gate of which is connected to said first potential supply source, and said second load element comprises a depletion type MOS transistor of the first conductivity type, a gate of which is connected to said second potential supply source.

44. A circuit according to claim 8, wherein said first conductivity type is N type, and said first potential supply source is Vcc.

45. A circuit according to claim 8, wherein said second conductivity type is P type and said second potential supply source is ground.

46. A circuit according to claim 8, wherein said first conductivity type is N type, and second conductivity type is P type, said first potential supply source is Vcc, and second potential supply source is ground.

* * * * *